United States Patent [19]

Dibble et al.

[11] Patent Number: 4,976,626

[45] Date of Patent: Dec. 11, 1990

[54] CONNECTOR FOR CONNECTING FLEXIBLE FILM CIRCUIT CARRIER TO BOARD OR CARD

[75] Inventors: Eric P. Dibble, Endicott; Alan D. Knight, Newark Valley, both of N.Y.

[73] Assignee: International Business Machines Corporation, Armonk, N.Y.

[21] Appl. No.: 287,236

[22] Filed: Dec. 21, 1988

[51] Int. Cl.⁵ .............................................. H01R 9/09
[52] U.S. Cl. ........................................ 439/67; 439/78
[58] Field of Search ........................ 439/55, 67, 74, 77, 439/492–495, 78; 361/400, 401–407, 412, 413, 414; 29/839, 840, 843

[56] References Cited

U.S. PATENT DOCUMENTS

| | | | |
|---|---|---|---|
| 3,811,186 | 5/1974 | Larnerd et al. | 174/68.5 |
| 3,961,228 | 6/1976 | Briggs | 361/412 |
| 4,184,729 | 1/1980 | Parks et al. | 339/17 F |
| 4,392,181 | 7/1983 | Jabben | 361/406 |
| 4,420,203 | 12/1983 | Aug et al. | 439/67 |
| 4,420,877 | 12/1983 | McKenzie, Jr. | 29/843 |
| 4,453,795 | 6/1984 | Moulin | 439/67 |
| 4,553,192 | 11/1985 | Babuka et al. | 439/66 |
| 4,587,596 | 5/1986 | Bunnell | 439/493 |

OTHER PUBLICATIONS

IBM Bulletin, Horton, vol. 5, No. 11, p. 47, 4–1963.

*Primary Examiner*—1
*Assistant Examiner*—Neil Abrams
*Attorney, Agent, or Firm*—Pollock, Vande Sande & Priddy

[57] ABSTRACT

A connector for connecting a circuit carrier to a board or card that includes a contact pin having a stem portion and a head portion. The head portion contains at least one hertz dot thereon. The outer surface of the hertz dot is gold.

13 Claims, 3 Drawing Sheets

CONNECTOR FOR CONNECTING FLEXIBLE FILM CIRCUIT CARRIER TO BOARD OR CARD

TECHNICAL FIELD

The present invention is concerned with a connector for connecting a flexible film circuit carrier to a board or card and is concerned with the use thereof. In particular, the connectors of the present invention include at least one hertz dot to provide improved contact between the surfaces to be connected.

In addition, the present invention is concerned with a flexible film in circuit carrier that is connected to an circuit board or card by the connector of the present invention.

The flexible film circuit carrier includes a contact pad that is mated to the hertz dot(s) of the connector.

BACKGROUND ART

Flexible film circuit carriers currently on the market are generally fabricated from polyimides or silicone polymers with copper lines as the electrical conductor. The flexible film circuit carriers are usually connected to another conductor member such as a circuit board or circuit card, for instance, for power or signal communication, by what is generally referred to as a "flat on flat" arrangement. For instance, the flexible film circuit carrier includes a flat contact pad which may be gold-plated.

The contact pad, in turn, lines up with a corresponding contact pad on the surface of, for example, the integrated circuit board to which the flexible carrier is to be contacted. The contact pad on the surface contains, for instance, gold to facilitate the subsequent mating process. However, in order to achieve adequate and reliable contact, it is necessary to employ considerable pressure or force to the substrates to be mated. Attempts to reduce the required force resulted in bonding of small metal spheres to the surface of one of the mating pads.

In addition, the prior processes require plating the entire contact pads and spheres with gold which involves significant expense, as well as engineering problems such as current distribution, relatively low yields, reworking, and the like. The need for providing the contact spheres also involves special handling which requires great care. Even with extraordinary care, problems still occur in handling of the relatively small sized gold spheres which, at times, results in the spheres being dislodged and falling into plated through-holes of the boards or cards.

SUMMARY OF INVENTION

The present invention provides for better contact between the surfaces to be joined while, at the same time, requiring lower contact pressures than used in prior art methods. In addition, the configuration of the present invention eliminates the need for handling of spheres and for the particular attachment arrangements required in the prior art.

In addition, the configuration of the present invention eliminates the need for full panel gold plating, as well as the costs and problems associated therewith experienced by the prior art techniques.

Furthermore, since the present invention eliminates the need for handling of gold spheres, it likewise also eliminates the possibility of spheres falling into the holes on circuit cards or boards as sometimes experienced in the prior art techniques.

In particular, the present invention is concerned with a connector for connecting flexible film circuit carrier to an integrated circuit board or card. The connector includes a contact pin that has a stem portion and a head portion. The head portion has a greater diameter than the stem portion. In addition, the head portion has at least one hertz dot(s). At least the outer surfaces of the hertz dot(s) are gold. A hertz dot is a connection system which produces a depression in a material where it rides against another material to provide or give a force against that other material.

In addition, the present invention is concerned with a flexible film circuit carrier that is connected to an integrated circuit board or card by the above-disclosed connector. The circuit carrier contains a circuit pad that is separably mated to at least one hertz dot of the connector. The stem portion of the contact pin is received in a through-hole of the board or card and is soldered to the walls of the through-hole with the bottom portion of the stem extending beyond the through-hole.

BEST AND VARIOUS MODES FOR CARRYING OUT THE INVENTION

Figure 3:
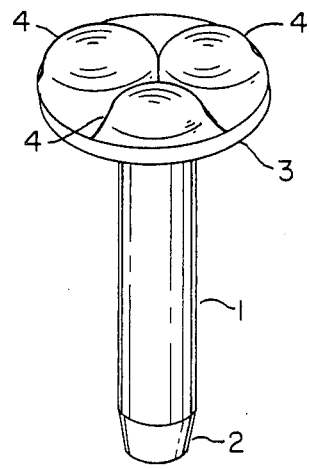
FIG. 3 is an isometric view of a preferred aspect of the present invention being a formed connector.

In order to facilitate understanding of the present invention, reference is made to FIG. 3 which is an isometric view of a connector in accordance with the present invention.

In particular, the numeral (1) represents the stem portion of the contact pin which includes a taper (2) at its lower end to facilitate insertion in the through-holes. Preferably, the stem is generally cylindrical in shape.

A typical dimension of the stem is about a 14 mil diameter and about 80 mils in length. A preferred material for preparing the stem, as well as the head of the connector, is a beryllium copper alloy such as beryllium copper alloy 173 which contains about 97.7% copper, about 1.9% beryllium, about 0.4% lead with trace amounts of nickel and cobalt and iron. Other suitable alloys include brass and phosphor-bronze. Since the stem is to be soldered to the walls of the through-hole in which it is inserted, the stem is coated to render it more susceptible to soldering. Typically, the stem can be coated with about 1–2 microns of nickel, followed by an outer coating of about 4 microns of gold.

The head (3) of the connector in the preferred embodiment (FIG. 3) has a diameter greater than the stem which, in a typical case, is about 40 mils. On the head is at least one hertz dot (4) which, typically, can have a radius of about 10 mils and a height of about 5 mils. According to preferred aspects of the present invention for compact symmetrical packages, three hertz dots are provided on the head and are arranged to represent the apexes of an equilateral triangle. Typically, the center of each hertz dot or sphere is about 18 mils apart. At least the outer surfaces of the hertz dot(s) are gold. Of course, if desired, the hertz dot(s) can be entirely gold. The height of the head is typically about 20 mils. For simplicity in fabricating the connectors according to the present invention, the entire head can be coated with a gold layer such as about 4 microns thick. However, it is recognized that it is only necessary that the hertz dots be coated with the gold. Between the gold layer and copper beryllium alloy is a nickel layer about 1-2 microns thick to provide a diffusion barrier.

Figure 1:
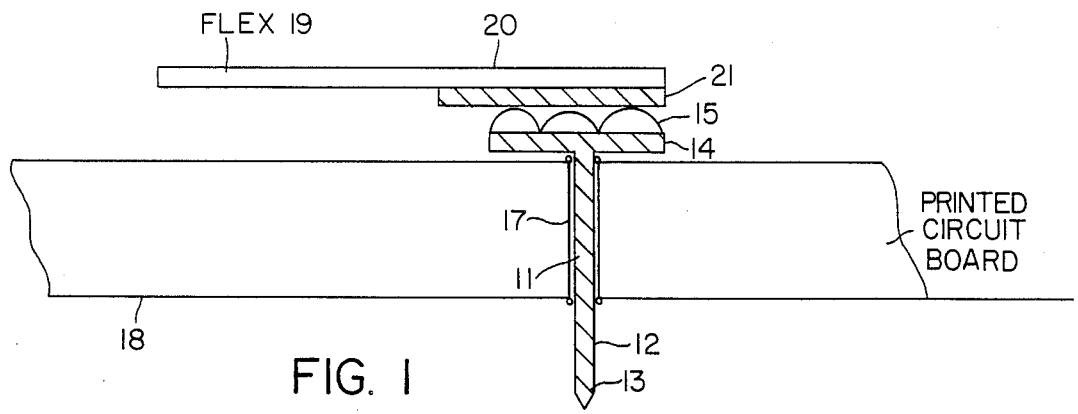
FIG. 1 is a schematic diagram illustrating a flexible film circuit carrier connected to a card or board pursuant to the present invention.

FIG. 1 is a schematic diagram of the connector of the present invention used to connect a flexible film circuit carrier to a printed circuit board or card. In particular, numeral (11) represents the connector of the present invention having a stem (12) with a tapered end (13) and extending beyond the bottom of the board or card (18). Connector (11) also includes a head (14) and hertz dots (15). The connector is soldered to the side wall (17) of the through-hole of the circuit board (18). Typical low-melting solders employed include tin lead such as 63-37 tin lead alloy, tin-bismuth, and tin-lead-indium alloy.

The flexible film circuit carrier (19) includes a flexible film (20) such as a polysilicone or preferably a polyimide.

The polyimides include unmodified polyimides, as well as modified polyimides such as polyester imides, polyimide-imide-esters, polyamide-imides, polysiloxane imides, as well as other mixed polyimides. Such are well-known in the prior art and need not be described in any detail herein.

Examples of polyimides are those obtained from pyromellitic dianhydride-oxydianaline.

The polyimide will contain electrically conductive circuit lines such as copper (not shown) and a contact pad (21) to register with the hertz dots.

Typical contact pad arrangement includes copper such as 1 ounce (1.4 mils thick) of copper adhered to the polyimide, followed by a layer of about 1-2 microns thick of nickel, and a layer of about 4 microns thick of gold. The arrangement provides for the possibility of what is referred to as "wipe" whereby the metal pad can move parallel to the hertz dots to contact and to provide for an increased metal-to-metal contact.

Figure 2:
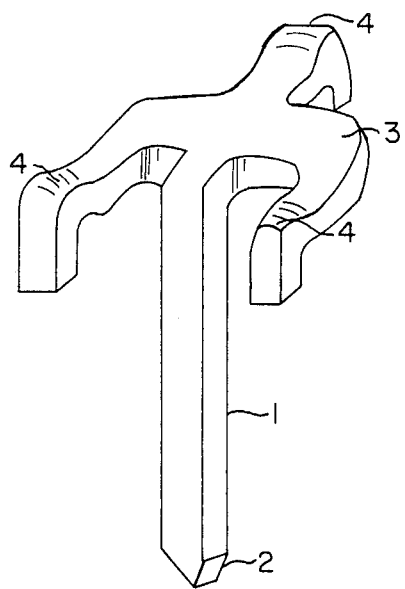
FIG. 2 is an isometric view of a stamped connector of the present invention.

FIG. 2 is an isometric view of a connector of the present invention, the configuration being obtained by stamping from a sheet of the alloy. In particular, the numeral (1) represents the stem portion of the contact pin which includes a taper (2) at its lower end. The head (3) of the connector has a diameter greater than the stem. On the head is at least one hertz dot. The materials and dimensions can be the same as those disclosed for the connector illustrated in FIG. 3.

Having thus described our invention, what we claim as new and desire to secure by Letters Patent is:

1. A connector for connecting flexible film circuit carrier to an integrated circuit board or card which comprises a contact pin having a stem portion for being joined to the circuit board or card and a head portion having a greater diameter than said stem portion and having three hertz spheres for producing a depression in contact pad of said carrier to provide a force against said contact pad thereon wherein at least the outer surface of said hertz spheres is gold.

2. The connector of claim 1 wherein the hertz spheres are arranged to represent the apexes of an equilateral triangle.

3. The connector of claim 1 being of copper-beryllium alloy.

4. The connector of claim 3 wherein a nickel layer is provided on said copper-beryllium alloy, followed by a layer of gold.

5. The connector of claim 1 wherein said stem is tapered at its lower extremity.

6. A combination of a flexible film circuit carrier connected to an integrated circuit board or card by the connector of claim 1 wherein said carrier comprises a contact pad that is mated to said hertz sphere, the stem portion of the contact pin being received in a through-hole of the board or card and soldered to the walls of the through-hole with the bottom portion of the stem extending beyond said through-hole.

7. The combination of claim 6 wherein said carrier includes a polyimide or polysilicone substrate.

8. The combination of claim 6 wherein said carrier includes a polyimide.

9. The combination of claim 1 wherein said contact pad includes a layer of copper adhered to the substrate of the carrier, followed by a layer of nickel and then a layer of gold.

10. The combination of claim 6 wherein the hertz spheres are arranged to represent the apexes of an equilateral triangle.

11. The combination of claim 6 wherein the connection comprises a copper-beryllium alloy.

12. The combination of claim 11 wherein a nickel layer is provided on a copper beryllium alloy, followed by a layer of gold.

13. The combination of claim 6 wherein said stem portion is tapered at its lower extremity.

* * * * *